(12) United States Patent
Seki et al.

(10) Patent No.: US 7,656,210 B2
(45) Date of Patent: Feb. 2, 2010

(54) SEMICONDUCTOR INTEGRATED CIRCUIT

(75) Inventors: Hiroshi Seki, Suwa (JP); Hideyuki Kakubari, Suwa (JP); Hiroshi Tokiwai, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/404,033

(22) Filed: Apr. 13, 2006

(65) Prior Publication Data

US 2006/0232320 A1    Oct. 19, 2006

(30) Foreign Application Priority Data

Apr. 14, 2005   (JP) ............................. 2005-116749

(51) Int. Cl.
*H03K 3/03* (2006.01)

(52) U.S. Cl. .................... 327/198; 327/143; 327/333

(58) Field of Classification Search ........................ None
See application file for complete search history.

(56) References Cited

U.S. PATENT DOCUMENTS

| | | | | |
|---|---|---|---|---|
| 4,633,107 | A * | 12/1986 | Norsworthy | ................. 327/198 |
| 5,731,713 | A | 3/1998 | Proebsting et al. | |
| 6,501,306 | B1 * | 12/2002 | Kim et al. | .................... 327/112 |
| 6,509,768 | B2 * | 1/2003 | Polizzi et al. | ................. 327/143 |
| 6,894,545 | B2 | 5/2005 | Kodama | |
| 7,119,578 | B2 * | 10/2006 | Correale et al. | ............... 326/81 |
| 7,205,682 | B2 * | 4/2007 | Kuramori | .................... 307/80 |

FOREIGN PATENT DOCUMENTS

| | | |
|---|---|---|
| JP | 05-136671 | 6/1993 |
| JP | 8-51352 | 2/1996 |
| JP | 09-252532 | 9/1997 |
| JP | 2004-165993 | 6/2004 |
| JP | 2004-208108 | 7/2004 |
| JP | 2004-356779 | 12/2004 |

\* cited by examiner

*Primary Examiner*—Tuan Lam
*Assistant Examiner*—Hiep Nguyen
(74) *Attorney, Agent, or Firm*—Harness, Dickey & Pierce, P.L.C.

(57) ABSTRACT

A semiconductor integrated circuit that operates on multiple supply potentials including a first potential and a second potential that is higher than the first potential. The semiconductor integrated circuit includes a potential-lowering circuit operating on the second supply potential and including an N-channel MOS transistor that lowers the second supply potential applied to a gate thereof to output a lowered potential from a source thereof, a judging circuit operating on the potential outputted from the potential-lowering circuit and judging whether the first supply potential is high-level or low-level, and a buffer circuit outputting a control signal showing whether the first supply potential is fed based on judgment outputted from the judging circuit.

7 Claims, 5 Drawing Sheets

SEMICONDUCTOR INTEGRATED CIRCUIT

BACKGROUND

1. Technical Field

The present invention generally relates to a semiconductor integrated circuit such as an integrated circuit (IC) or a large-scale integration (LSI), and more particularly to a semiconductor integrated circuit that operates on multiple supply potentials.

2. Related Art

In recent years, semiconductor integrated circuits such as ICs or LSIs used in various electronic equipments have become increasingly highly-integrated and achieved lower operation voltages so that a high-speed operation and low power-consumption can be realized for those equipments. However, in view of the properties that are device-specific, it is extremely difficult to lower the operating voltage of all semiconductor integrated circuits in a unified manner. Thus, there arise cases in which multiple semiconductor integrated circuits operating on different supply potentials are interconnected.

In order to cope with such cases, a semiconductor integrated circuit having an internal circuit that operates on a low supply potential and an output driver that operates on a high supply potential has been developed. An example of such a semiconductor integrated circuit thus operating on two types of supply potentials will be described below with reference to FIG. 1.

The semiconductor integrated circuit shown in FIG. 1 includes an internal circuit 10, level-shifting circuits 21 and 22, a power-on-control (POC) circuit 30, an N-channel MOS transistor 41, a P-channel MOS transistor 42, inverters 51 and 52, and an output driver 60. The output driver 60 is composed of a P-channel MOS transistor 61 and an N-channel MOS transistor 62.

The semiconductor integrated circuit is supplied with a low supply potential $LV_{DD}$ (e.g. 1.5 V), a high supply potential $HV_{DD}$ (e.g. 3.3 V) and a reference potential $V_{ss}$. When fed with signals from the internal circuit 10, the level-shifting circuits 21 and 22 shift the levels of the signals, thereby respectively generating signals of the levels best suited respectively to the inverters 51 and 52 operating on the supply potential $HV_{DD}$. After being inverted respectively by the inverters 51 and 52, these signals are fed to the respective gates of the transistors 61 and 62 included in the output driver 60. The output signals outputted from the drains of the transistors 61 and 62 are fed via a pad to an external circuit operating on a supply potential that is equal to or higher than the potential $HV_{DD}$.

In such a semiconductor integrated circuit, there arise some cases in which the supply potential $HV_{DD}$ is fed even when the supply potential $LV_{DD}$ is not fed because the external circuit connected to the pad is in operation, for example. In such cases, a high-impedance state (inconstant electric potential) occurs in outputs from the internal circuit 10, generating an inconstant state in outputs from the level-shifting circuits 21 and 22. Then, there is a risk depending on the electric potential of those outputs in which both of the transistors 61 and 62 included in the output driver 60 may come to an on-state to cause a through-current to flow. To cope with such a situation, the transistors 41 and 42 are turned on to fix the input potentials of the inverters by having the POC circuit 30 output high-level POC signals and low-level inverted POC signals when the supply potential $LV_{DD}$ is not fed. Accordingly, the transistors 61 and 62 included in the output driver 60 are both turned off.

FIG. 5 is a circuit diagram showing the configuration of a related art POC circuit. The POC circuit includes a resistance R1 connected to the supply potential $LV_{DD}$, P-channel MOS transistors QP61 and QP62 and N-channel MOS transistors QN61 and QN62 in series connection, P-channel MOS transistors QP71 and QP72 and a resistance R2 in series connection, a P-channel MOS transistor QP81 and an N-channel MOS transistor QN81 constituting an inverter A, and a P-channel MOS transistor QP91 and an N-channel MOS transistor QN91 constituting an inverter B.

The supply potential $LV_{DD}$ is low-level when it is not fed, so that the transistors QP61 and QP62 are in an on-state while the transistors QN61 and QN62 are in an off-state. Therefore, the inverter A, being inputted with high-level signals, outputs low-level inverted POC signals, while the inverter B, being inputted with low-level inverted POC signals, outputs high-level POC signals. The inverted POC signals are fed back positively to the transistor QP71 to further stabilize the state.

On the contrary, when the supply potential $LV_{DD}$ is fed, the relationship is reversed between the levels of each unit, with the inverter A outputting high-level inverted POC signals and the inverter B outputting low-level POC signals. However, when the supply potential $LV_{DD}$ is 1.5 V and the supply potential $HV_{DD}$ is 3 V, the source potential of the transistor QP61 is 3 V while its gate potential is 1.5 V. Therefore, the transistors QP61 and QP62 are precluded from being in an off-state and a through-current flows through the series-connected transistors QP61 and QP62 and QN61 and QN62. The larger the difference between the supply potentials $LV_{DD}$ and $HV_{DD}$, the larger the through-current that flows. Related art methods reduce the through-current by lowering the capacities of the transistors QP61 and QP62 to supply currents. However, since special-size transistors are needed for that purpose, causing a burden on layout designing for semiconductor integrated circuits.

JP-A-9-252532 is a first example of related art. It discloses a supply voltage detecting circuit that, in controlling an increase in power consumption, automatically generates supply voltage classifying signals to be inputted to an electronic circuit that responds to various supply voltages. In FIG. 1 of the publication, a supply voltage sensing circuit 16A determines a reference voltage V3 to be low-level when a supply voltage VDDX is 5 V, while it determines the reference voltage V3 to be high-level when the supply voltage VDDX is 5 V. However, the publication discloses no idea about reducing a through-current that flows in a circuit when only one type of supply potential out of two is fed.

JP-A-5-136671 is a second example of related art. It discloses a level-detecting circuit that is embedded in a semiconductor integrated circuit and applied to a starter circuit, for example, that controls an internal circuit so that it is deactivated while a supply voltage is lower than a predetermined level. In FIG. 1 of the publication, level-detection is performed by dropping a supply voltage VCC by as much as the threshold voltages of three NMOS transistors and applying the lowered supply voltage VCC to the gate of an NMOS transistor 27, thus causing a drain voltage STTX to change in accordance with the gate voltage of the transistor 27. However, the publication discloses no idea, about reducing a through-current that flows when only one type of supply potential out of two is fed.

JP-A-2004-208108 is a third example of related art. It discloses an integrated circuit that is provided with a circuit block controlling supply of power during a standby or other operation and prevents through-currents that are caused by unstable signals outputted from the circuit block in which power supply is disconnected. In FIG. 1 of the publication, when a mask signal MASK is turned to "L"prior to a power-off operation for the circuit block 10, a node N1 is maintained at "L"by a latching circuit 24 composed of a NAND 24a and an inverter 24b. Thereafter, when a supply potential VDD1 is lowered to an "L"level through a power-off operation, output signals of the NAND 24a are fixed at "H". Even if an unstable mask signal MASK is outputted from the circuit block 10 in this state, the level of the node Ni is maintained at "L". Thus, gate circuits $21_1$ to $21_n$ remain closed, thereby preventing through-currents in a logical circuit 22, caused by unstable signals $SIG_1$ to $SIG_n$ from the circuit block 10. However, in cases where two types of supply potentials are fed to the integrated circuit, if the supply potential fed to the NAND 24a, for example, is higher than the supply potential VDD1, a large through-current will flow unless the capacity of the NAND 24a to feed currents is controlled to a large extent.

JP-A-2004-165993 is a fourth example of related art. It discloses an interface device with multiple power supplies in a semiconductor integrated circuit. The interface device determines the state of an internal circuit and controls through-currents and collision currents, even in a transitional state of a semiconductor device having multiple power supplies, where one power supply is already in an on-state while the other power supply is still in an off-state. In FIG. 1 of the publication, a transistor 10 feeds a supply voltage to a buffer circuit 12 in a transitional state where an internal power supply 15 is already in an on-state while an external I/O power supply 13 is still in an off-state. However, a through-current may flow in the buffer circuit 12 if an external terminal connected to the input of the buffer circuit 12 is in a floating state.

SUMMARY

An advantage of the invention is to reduce through-currents that flow when only one type of supply potential out of two is fed in a semiconductor integrated circuit operating on multiple supply potentials.

A semiconductor integrated circuit according to an aspect of the invention operates on multiple supply potentials including a first supply potential and a second supply potential that is higher than the first supply potential. The semiconductor integrated circuit includes a potential-lowering circuit operating on the second supply potential and including an N-channel MOS transistor lowering the second supply potential applied to a gate thereof to output a lowered potential from a source thereof, a judging circuit operating on the potential outputted from the potential-lowering circuit and judging whether the first supply potential is high-level or low-level, and a buffer circuit outputting a control signal showing whether the first supply potential is fed based on judgment outputted from the judging circuit.

The above potential-lowering circuit may include multiple N-channel MOS transistors whose drain-source paths are series-connected and whose gates are applied with the second supply potential. The potential-lowering circuit may be configured by series-connecting multiple N-channel MOS transistors that are in saturation condition.

The above judging circuit may include a first inverter that receives and inverts the first supply potential, multiple P-channel MOS transistors whose source-drain paths are series-connected between the second supply potential and an output node of the first inverter, and a second inverter that inverts a signal outputted from the first inverter. In this case, the second inverter outputs a signal to be fed to a gate of a first P-channel MOS transistor out of the multiple P-channel MOS transistors, and a gate of another P-channel MOS transistor out of the multiple P-channel. MOS transistors is connected to a ground potential.

The judging circuit may include a first inverter that receives and inverts the first supply potential, multiple P-channel MOS transistors whose source-drain paths are series-connected between the second supply potential and an output node of the first inverter, and a second inverter that inverts a signal outputted from the first inverter. In this case, the second inverter outputs a signal to be fed to a gate of a first P-channel MOS transistor out of the multiple P-channel MOS transistors, and a gate of another P-channel MOS transistor out of the multiple P-channel MOS transistors is connected to the first potential.

The first inverter may include multiple P-channel MOS transistors whose source-drain paths are series-connected and whose gates are applied with the first supply potential, and the second inverter may include multiple P-channel MOS transistors whose source-drain paths are series-connected and whose gates are applied with signals outputted from the first inverter. The buffer circuit may include multiple inverters and output a differential signal showing whether the first supply potential is fed based on judgment outputted from the judging circuit.

The semiconductor integrated circuit described above may further include an internal circuit that operates on the first supply potential, a first level-shifter and a second level-shifter that shift a potential of a signal outputted from the internal circuit, an output driver including a P-channel MOS transistor and an N-channel MOS transistor that are series-connected to generate an output signal based on a signal outputted from the first level-shifter and the second level-shifter, respectively, if the second supply potential is fed, and a switching circuit that fixes a gate potential of the P-channel MOS transistor at a high level and a gate potential of the N-channel MOS transistor at a low level based on the control signal outputted from the buffer circuit.

Accordingly, the judging circuit is fed with a supply potential obtained by the potential-lowering circuit lowering the second supply potential. Therefore, through-currents flowing in the judging circuit when only the second supply potential is fed are reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the invention will now be described with reference to the drawings. Like numerals indicate like elements and a detailed description thereof will be omitted.

Figure 1:
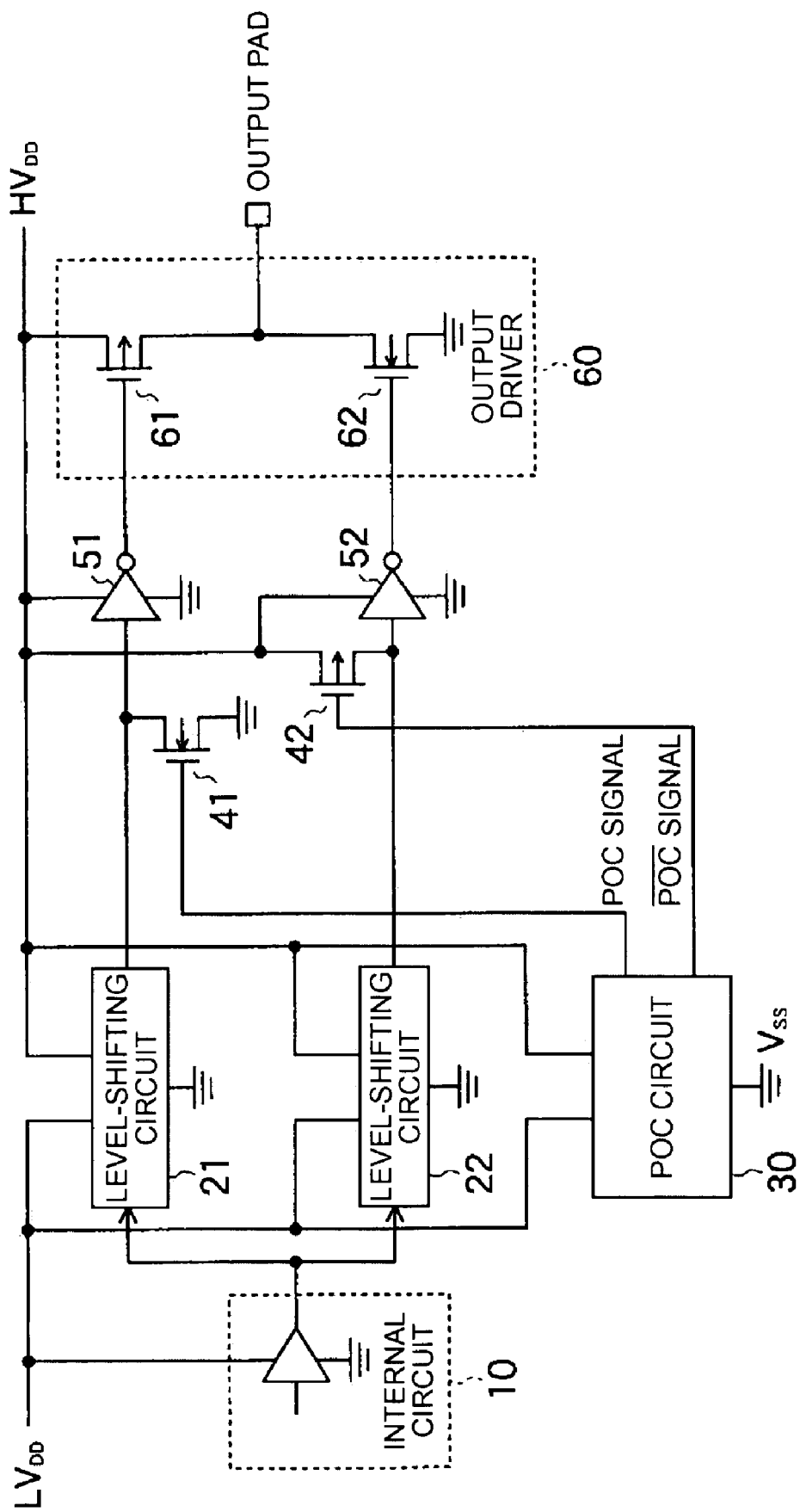
FIG. 1 illustrates the configuration of a semiconductor integrated circuit according to a first embodiment of the invention.

FIG. 1 illustrates the configuration of a semiconductor integrated circuit according to a first embodiment of the invention. As shown therein, the semiconductor integrated circuit includes an internal circuit 10, level-shifting circuits 21 and 22, a power-on-control (POC) circuit 30, an N-channel MOS transistor 41, a P-channel MOS transistor 42, inverters 51 and 52, and an output driver 60. The output driver 60 is composed of a P-channel MOS transistor 61 and an N-channel MOS transistor 62.

The semiconductor integrated circuit is fed with a low supply potential $LV_{DD}$ (e.g. 1.5 V), a high supply potential $HV_{DD}$ (e.g. 3.3 V) and a reference potential $V_{ss}$ (e.g. ground potential of 0 V). When fed with signals from the internal circuit 10, the level-shifting circuits 21 and 22 shift the level of the signals, thereby respectively generating signals of a level that is suited to the inverters 51 and 52 operating on the supply potential $HV_{DD}$. After being inverted respectively by the inverters 51 and 52, these signals are respectively fed to the gates of the transistors 61 and 62 included in the output driver 60. Output signals outputted from the drains of the transistors 61 and 62 are fed via a pad to an external circuit operating on a supply potential that is equal to or higher than the potential $HV_{DD}$.

In such a semiconductor integrated circuit, there arise some cases in which the supply potential $HV_{DD}$ is fed while the supply potential $LV_{DD}$ is not fed because the external circuit connected to the pad is in operation, for example. In such cases, a high-impedance state (inconstant electric potential) occurs in outputs from the internal circuit 10, generating an inconstant state in outputs from the level-shifting circuits 21 and 22. Then, there is a risk depending on the electric potential of those outputs in which both of the transistors 61 and 62 included in the output driver 60 may come to an on-state and cause a through-current to flow. To cope with such a situation, the transistors 41 and 42 are turned on to fix the input potentials of the inverters by having the POC circuit 30 output high-level POC signals and low-level inverted POC signals when the supply potential $LV_{DD}$ is not fed. Accordingly, the transistors 61 and 62 included in the output driver 60 are both turned off.

Figure 2:
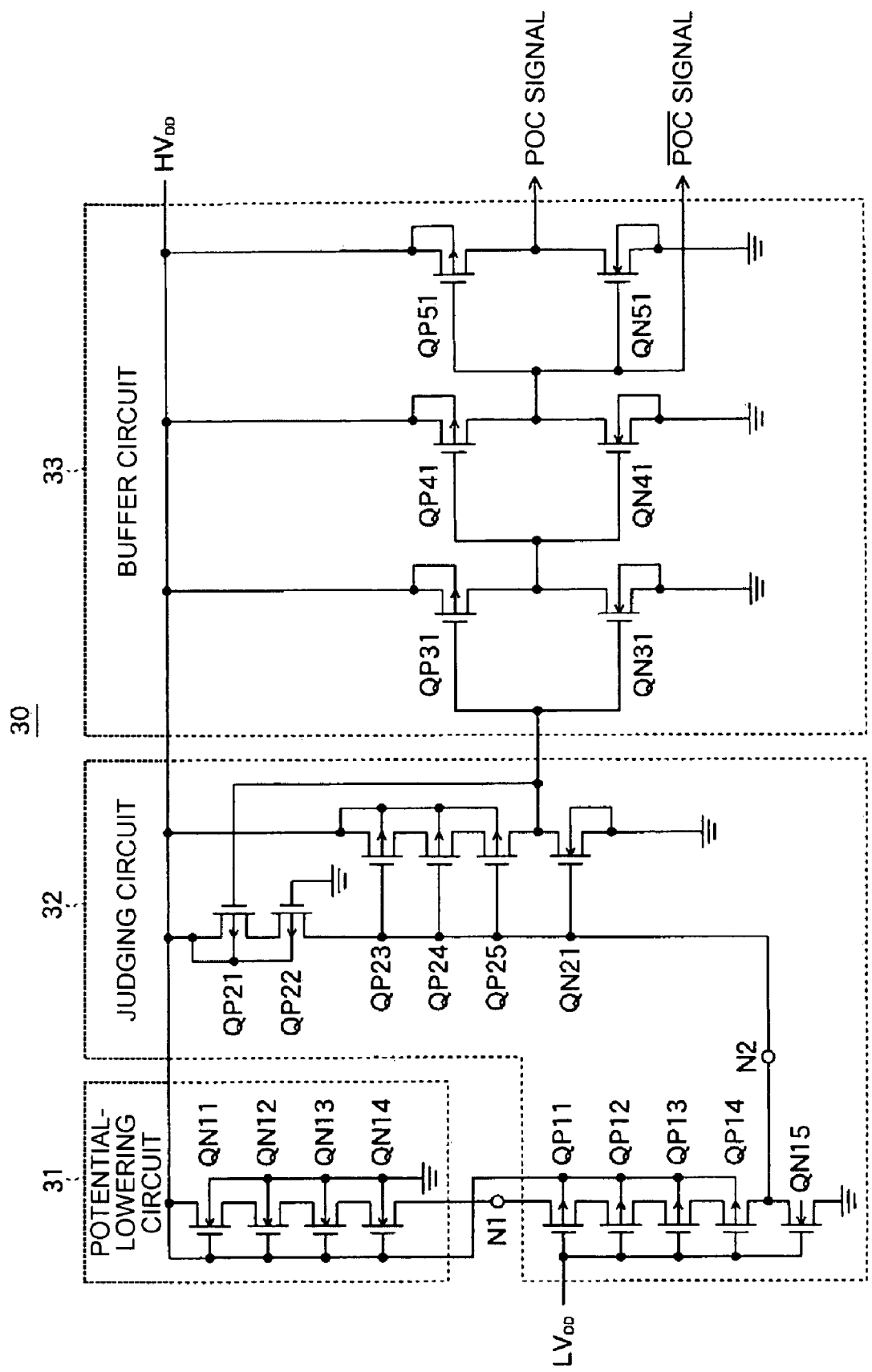
FIG. 2 is a circuit diagram showing the configuration of a POC circuit used in the first embodiment of the invention.

FIG. 2 is a circuit diagram showing the configuration of the POC circuit used in the first embodiment of the invention. The POC circuit 30 includes a potential-lowering circuit 31 that lowers and outputs the supply potential $HV_{DD}$ when it is fed, a judging circuit 32 that operates on a potential outputted from the potential-lowering circuit 31 and judges whether the supply potential $LV_{DD}$ is high-level or low-level, and a buffer circuit 33 that outputs differential POC signals and inverted POC signals as control signals showing whether or not the supply potential $LV_{DD}$ is fed.

In the potential-lowering circuit 31, the drain-source regions of multiple N-channel MOS transistors QN11 to QN14 are series-connected. Thus, the gates of the transistors QN11 to QN14 are applied with the supply potential $HV_{DD}$ when the drain of the transistor QN11 is applied with the supply potential $HV_{DD}$. The transistor QN14 lowers the supply potential $HV_{DD}$ applied to its gate and outputs the lowered supply potential from its source.

Figure 3A:
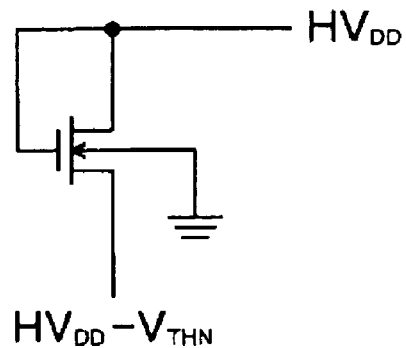
FIG. 3 illustrates specific examples of a potential-lowering circuit shown in FIG. 2.

In the present embodiment, the multiple transistors QN11 to QN14 included in the potential-lowering circuit 31 may be replaced with one N-channel MOS transistor, as shown in FIG. 3A. In this case, the potential at the source of the transistor (the node N1 in FIG. 2) is: $HV_{DD}-V_{THN}$, where $V_{THN}$ represents the gate-to-source threshold voltage of the N-channel MOS transistor. For example, when $HV_{DD}$ is 3.3 V and $V_{THN}$ is 0.6 V, the potential at the node N1 is 2.7 V. When the multiple N-channel MOS transistors are series-connected, as shown in FIG. 2, the potential at the node N1 is somewhat lower.

Figure 3B:
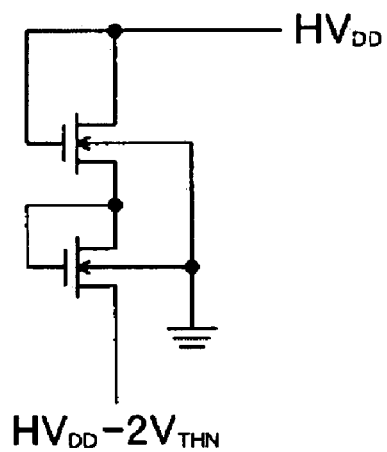
Figure 3C:
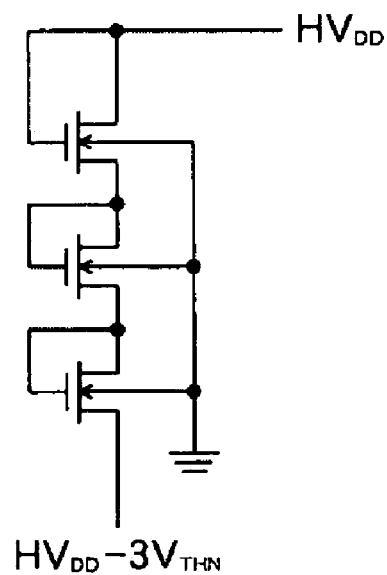

As shown in FIGS. 3B and 3C, the potential-lowering circuit 31 may also be configured by series-connecting multiple N-channel MOS transistors that are saturation-connected. In this case, the potential at the source of the last transistor (the node N1 in FIG. 2) can be lowered to: $HV_{DD}-N\cdot V_{THN}$, where N represents the number of the series-connected transistors.

Referring again to FIG. 2, the judging circuit 32 includes a first inverter composed of multiple P-channel MOS transistors QP11 to QP14 and an N-channel MOS transistor QN15, multiple P-channel MOS transistors QP21 and QP22 whose source-drain paths are series-connected between the supply potential $HV_{DD}$ and an output node N2 of the first inverter, and a second inverter composed of multiple P-channel MOS transistors QP23 to QP25 and an N-channel MOS transistor QN21.

In FIG. 2, the multiple P-channel MOS transistors QP11 to QP14 included in the first inverter may be replaced with one P-channel MOS transistor. In the same manner, the multiple P-channel MOS transistors QP23 to QP25 included in the second inverter may be replaced with one P-channel MOS transistor.

In the first inverter, a neutral potential for operation is about the midpoint between the potential at the node N1 and the reference potential $V_{ss}$. The first inverter outputs low-level signals when the supply potential $LV_{DD}$ is higher than the neutral potential, and outputs high-level signals when it is lower than the neutral potential. For example, provided that the potential at the node N1 is 2.7 V, the neutral potential is about 1.35 V, so that the first inverter outputs low-level signals when 1.5 V is inputted as the supply potential $LV_{DD}$, interpreting the potential as high-level.

In the present embodiment, the potential at the node N1 is lower than the supply potential $HV_{DD}$, having been lowered by the potential-lowering circuit 31, so that the value of a through current flowing in the potential-lowering circuit 31 and the first inverter of the judging circuit 32 can be made lower than in related art. Furthermore, the present embodiment can be applied to the input and output section of a gate array or an embedded array, since no special-size transistors are required.

Signals outputted from the first inverter are inputted into the second inverter, from which signals of an inverted level are further outputted. The signals outputted from the second inverter are fed to the gate of the transistor QP21, which further outputs signals from its drain. The outputted signals are positively fed back via the transistor QP22 to the input of the second inverter to further stabilize the state. Here, the gate of the transistor QP22 is connected to the reference potential $V_{ss}$. Therefore, if high-level signals are fed from the drain of the transistor QP21 to the source of the transistor QP22 while the supply potential $LV_{DD}$ is not fed, the transistor QP22 comes to a complete on-state.

The buffer circuit 33 includes a third inverter composed of a P-channel MOS transistor QP31 and an N-channel MOS transistor QN31, a fourth inverter composed of a P-channel MOS transistor QP41 and an N-channel MOS transistor QN41, and a fifth inverter composed of a P-channel MOS transistor QP51 and an N-channel MOS transistor QN51, and outputs inverted POC signals from the fourth inverter and outputs POC signals from the fifth inverter.

Figure 4:
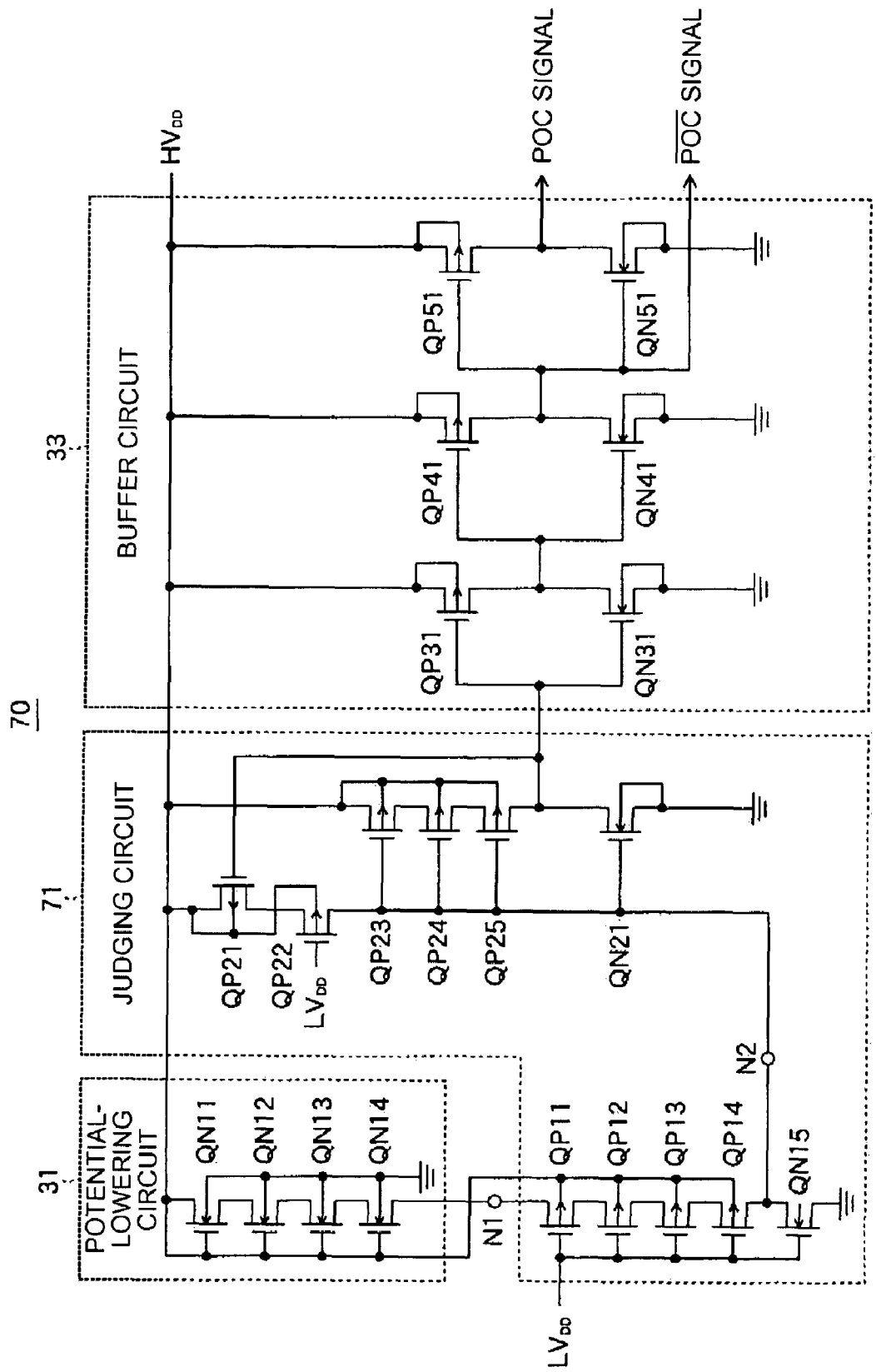
FIG. 4 is a circuit diagram showing the configuration of a POC circuit used in a second embodiment of the invention.
Figure 5:
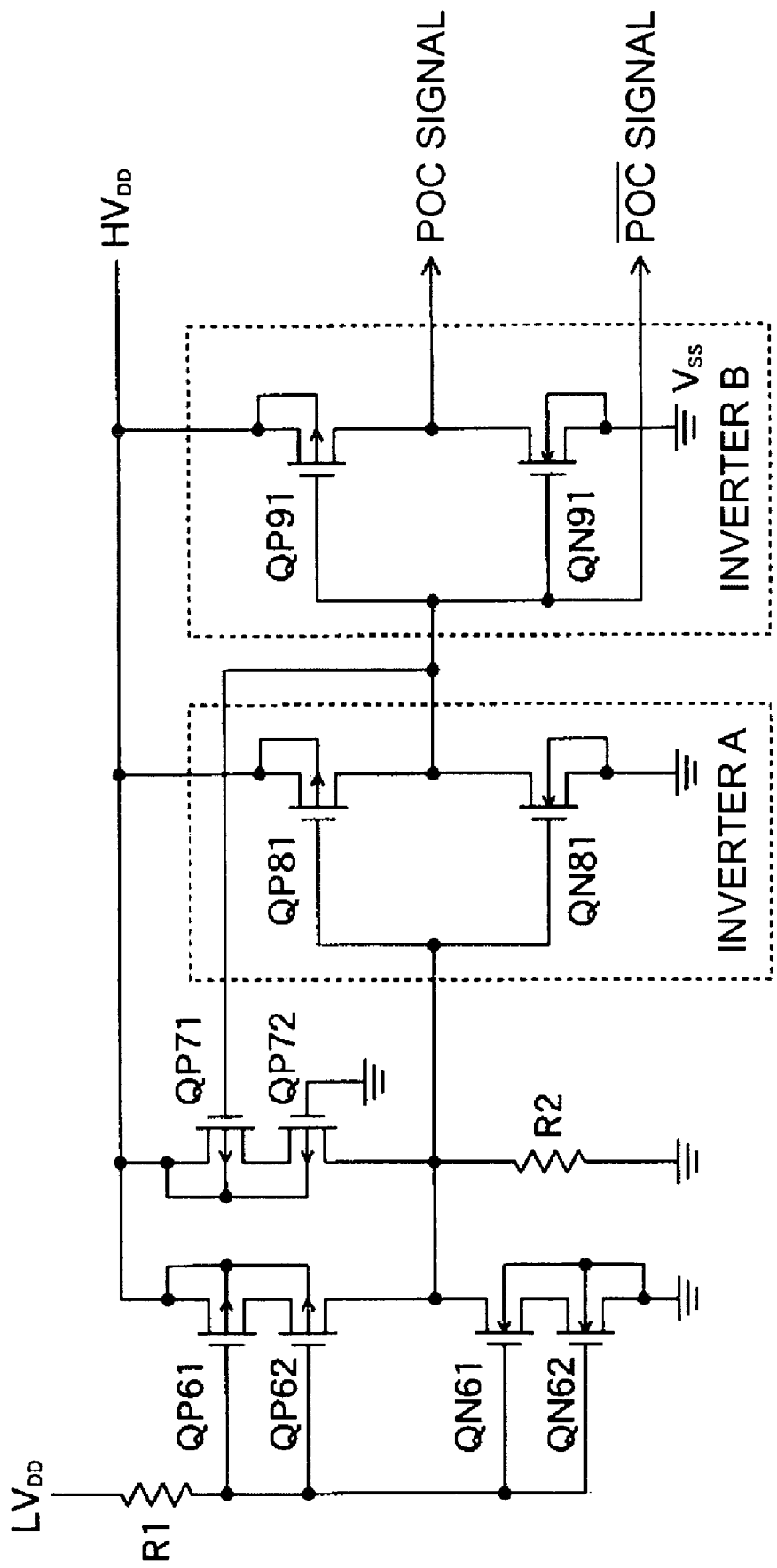
FIG. 5 is a circuit diagram showing the configuration of a related art POC circuit.

A second embodiment of the invention will be described. FIG. 4 is a circuit diagram showing the configuration of a POC circuit used in the second embodiment. The POC circuit 70 used in the second embodiment is a modification of the POC circuit 30 (FIG. 2) used in the first embodiment, where the judging circuit 32 in the POC circuit 30 is replaced with a judging circuit 71. All the other portions are the same as in the POC circuit 30 shown in FIG. 2.

As shown in FIG. 4, in the judging circuit 71, the gate of the P-channel MOS transistor QP22 is connected to the supply potential $LV_{DD}$, not to the reference potential $V_{ss}$.

As described earlier, in cases where the gate of the transistor QP22 is connected to the reference potential $V_{ss}$, the transistor QP22 comes to a complete on-state if high-level signals are fed from the drain of the transistor QP21 to the source of the transistor QP22 while the supply potential $LV_{DD}$ is not fed. Therefore, in order to change the node N2 from high-level to low-level when feeding of the supply potential $LV_{DD}$ is started, the N-channel MOS transistor QN15 needs to pass a current surpassing capability of QP22 for current. The transistor QN15 thus needs to be provided with a large capacity to supply currents, while the current flowing when the node N2 changes from high-level to low-level becomes also large.

In contrast, in the present embodiment, the gate of the transistor QP22 is connected to the supply potential $LV_{DD}$, so that the current outputted from the drain of the transistor QP22 can be reduced in line with an increase in the supply potential $LV_{DD}$. Therefore, it becomes unnecessary to provide the transistor QN15 with a large capacity to supply currents, and a special-size transistor is thus not required. Accordingly, the present embodiment is also applicable to the input and output section of a gate array or an embedded array.

What is claimed is:

1. A semiconductor integrated circuit operating on multiple supply potentials including a first supply potential and a second supply potential that is higher than the first supply potential, comprising:
   a potential-lowering circuit operating on the second supply potential and including an N-channel MOS transistor whose gate and drain receive the second supply potential and that outputs a third supply potential from a source thereof, the third supply potential being lower than the second supply potential;
   a judging circuit operating on the third supply potential outputted from the potential-lowering circuit and judging whether the first supply potential is high-level or low-level;
   a buffer circuit outputting a control signal showing whether the first supply potential is fed based on judgment outputted from the judging circuit,
   the judging circuit including:
      a first inverter that receives and inverts the first supply potential; and
      multiple P-channel MOS transistors whose source-drain paths are series-connected between the second supply potential and an output node of the first inverter, and
   the judging circuit includes a second inverter that inverts a signal outputted from the first inverter, a signal outputted from the second inverter is fed to a gate of a first P-channel MOS transistor out of the multiple P-channel MOS transistors, and a gate of another P-channel MOS transistor out of the multiple P-channel MOS transistors is connected to the first supply potential.

2. The semiconductor integrated circuit according to claim 1, the potential-lowering circuit includes multiple N-channel MOS transistors whose drain-source paths are series-connected and whose gates are applied with the second supply potential.

3. The semiconductor integrated circuit according to claim 1, the potential-lowering circuit is constituted by series-connecting multiple N-channel MOS transistors that are saturation-connected.

4. The semiconductor integrated circuit according to claim 1, the judging circuit includes a second inverter that inverts a signal outputted from the first inverter, a signal outputted from the second inverter is fed to a gate of a first P-channel MOS transistor out of the multiple P-channel MOS transistors, and a gate of another P-channel MOS transistor out of the multiple P-channel MOS transistors is connected to a ground potential.

5. A semiconductor integrated circuit operating on multiple supply potentials including a first supply potential and a second supply potential that is higher than the first supply potential, comprising:
   a potential-lowering circuit operating on the second supply potential and including an N-channel MOS transistor whose gate and drain receive the second supply potential and that outputs a third supply potential from a source thereof; the third supply potential being lower than the second supply potential;
   a judging circuit operating on the third supply potential outputted from the potential-lowering circuit and judging whether the first supply potential is high-level or low-level;
   a buffer circuit outputting a control signal showing whether the first supply potential is fed based on judgment outputted from the judging circuit,
   the judging circuit including:
      a first inverter that receives and inverts the first supply potential; and
      multiple P-channel MOS transistors whose source-drain paths are series-connected between the second supply potential and an output node of the first inverter,
   the judging circuit includes a second inverter that inverts a signal outputted from the first inverter, a signal outputted from the second inverter is fed to a gate of a first P-channel MOS transistor out of the multiple P-channel MOS transistors, and a gate of another P-channel MOS transistor out of the multiple P-channel MOS transistors is connected to a ground potential,
   the first inverter includes multiple P-channel MOS transistors whose drain-source paths are series-connected and whose gates are applied with the first supply potential, and
   the second inverter includes multiple P-channel MOS transistors whose source-drain paths are series-connected and whose gates are applied with signals outputted from the first inverter.

6. The semiconductor integrated circuit according to claim 1,
   the buffer circuit includes multiple inverters and outputs a differential signal showing whether the first supply potential is fed based on judgment outputted from the judging circuit.

7. A semiconductor integrated circuit operating on multiple supply potentials including a first supply potential and a second supply potential that is higher than the first supply potential, comprising:
   a potential-lowering circuit operating on the second supply potential and including an N-channel MOS transistor whose gate and drain receive the second supply potential and that outputs a third supply potential from a source thereof, the third supply potential being lower than the second supply potential;

a judging circuit operating on the third supply potential outputted from the potential-lowering circuit and judging whether the first supply potential is high-level or low-level;

a buffer circuit outputting a control signal showing whether the first supply potential is fed based on judgment outputted from the judging circuit;

an internal circuit that operates on the first supply potential;

a first level-shifter and a second level-shifter that shift a potential of a signal outputted from the internal circuit;

an output driver including a P-channel MOS transistor and an N-channel MOS transistor that are series-connected to generate an output signal based on a signal outputted from the first level-shifter and the second level-shifter, respectively, when the second supply potential is fed; and a switching circuit that fixes a gate potential of the P-channel MOS transistor at a high level and a gate potential of the N-channel MOS transistor at a low level based on the control signal outputted from the buffer circuit, the judging circuit including:
  a first inverter that receives and inverts the first supply potential; and
  multiple P-channel MOS transistors whose source-drain paths are series-connected between the second supply potential and an output node of the first inverter.

* * * * *